(12) United States Patent
Chien et al.

(10) Patent No.: US 11,832,372 B2
(45) Date of Patent: *Nov. 28, 2023

(54) EUV LIGHT SOURCE AND APPARATUS FOR LITHOGRAPHY

(71) Applicant: TAIWAN SEMICONDUCTOR MANUFACTURING COMPANY, LTD., Hsinchu (TW)

(72) Inventors: Shang-Chieh Chien, New Taipei (TW); Po-Chung Cheng, Longxing Village (TW); Chia-Chen Chen, Hsinchu (TW); Jen-Yang Chung, Penghu County (TW); Li-Jui Chen, Hsinchu (TW); Tzung-Chi Fu, Miaoli (TW); Shang-Ying Wu, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/688,287

(22) Filed: Mar. 7, 2022

(65) Prior Publication Data

US 2022/0191999 A1 Jun. 16, 2022

Related U.S. Application Data

(62) Division of application No. 15/801,225, filed on Nov. 1, 2017, now Pat. No. 11,272,606.

(60) Provisional application No. 62/525,570, filed on Jun. 27, 2017.

(51) Int. Cl.
*H05G 2/00* (2006.01)
*G03F 7/20* (2006.01)
*G03F 7/00* (2006.01)

(52) U.S. Cl.
CPC ......... *H05G 2/005* (2013.01); *G03F 7/70033* (2013.01); *G03F 7/70916* (2013.01); *H05G 2/008* (2013.01)

(58) Field of Classification Search
None
See application file for complete search history.

(56) References Cited

U.S. PATENT DOCUMENTS

| 3,623,828 A | 11/1971 | Shapiro |
| 6,795,166 B2 | 9/2004 | Kato et al. |
| 2007/0035252 A1 | 2/2007 | Becker et al. |
| 2008/0011967 A1 | 1/2008 | Van Herpen et al. |
| 2009/0231707 A1 | 9/2009 | Ehm et al. |

(Continued)

OTHER PUBLICATIONS

Anonymous, Research Disclosure, 603040 (2014).

(Continued)

*Primary Examiner* — Michael J Logie
(74) *Attorney, Agent, or Firm* — Studebaker & Brackett PC

(57) ABSTRACT

An extreme ultra violet (EUV) radiation source apparatus includes a collector, a target droplet generator for generating a tin (Sn) droplet, a rotatable debris collection device and a chamber enclosing at least the collector and the rotatable debris collection device. The rotatable debris collection device includes a first end support, a second end support and a plurality of vanes, ends of which are supported by the first end support and the second end support, respectively. A surface of at least one of the plurality of vanes is coated by a catalytic layer, which reduces a $SnH_4$ to Sn.

20 Claims, 7 Drawing Sheets

(56) References Cited

U.S. PATENT DOCUMENTS

| | | | |
|---|---|---|---|
| 2010/0053576 | A1 | 3/2010 | Loopstra et al. |
| 2010/0090132 | A1 | 4/2010 | Endo et al. |
| 2011/0186082 | A1 | 8/2011 | Yonekawa |
| 2012/0182536 | A1 | 7/2012 | Loopstra et al. |
| 2014/0110351 | A1 | 4/2014 | Fahs, II |
| 2014/0199543 | A1 | 7/2014 | Ehm et al. |
| 2015/0338753 | A1 | 11/2015 | Riepen et al. |
| 2016/0209753 | A1 | 7/2016 | Zhao et al. |
| 2016/0274467 | A1 | 9/2016 | Schimmel et al. |
| 2018/0246413 | A1 | 8/2018 | Ehm et al. |
| 2020/0233319 | A1 | 7/2020 | Koevoets et al. |

OTHER PUBLICATIONS

Anonymous, Research Disclosure, 604040 (2014).
Research Disclosure, 613053 (2015).
Ugur et al., "Decomposition of SnH4 molecules on metal and metal-oxide surfaces", Applied Surface Science. (2014).
Non-Final Office Action issued in U.S. Appl. No. 15/801,225, dated Jan. 14, 2019.
Final Office Action issued in U.S. Appl. No. 15/801,225, dated Apr. 26, 2019.
Non-Final Office Action issued in U.S. Appl. No. 15/801,225, dated Dec. 5, 2019.
Final Office Action issued in U.S. Appl. No. 15/801,225, dated Apr. 17, 2020.
Non-Final Office Action issued in U.S. Appl. No. 15/801,225, dated Oct. 8, 2020.
Final Office Action issued in U.S. Appl. No. 15/801,225, dated Feb. 12, 2021.
Non-Final Office Action issued in U.S. Appl. No. 15/801,225, dated May 19, 2021.
Final Office Action issued in U.S. Appl. No. 15/801,225, dated Aug. 27, 2021.
Notice of Allowance issued in U.S. Appl. No. 15/801,225, dated Oct. 29, 2021.

EUV LIGHT SOURCE AND APPARATUS FOR LITHOGRAPHY

This application is a divisional application of U.S. application Ser. No. 15/801,225 filed on Nov. 1, 2017, now U.S. Pat. No. 11,272,606, which claims priority of Provisional Application No. 62/525,570 filed on Jun. 27, 2017, the entire contents of each of which are incorporated herein by reference.

TECHNICAL FIELD

This disclosure relates to pattern forming methods used in semiconductor manufacturing processes, and an apparatus for lithography.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, the need to perform higher resolution lithography processes grows. One lithography technique is extreme ultraviolet lithography (EUVL). The EUVL employs scanners using light in the extreme ultraviolet (EUV) region, having a wavelength of about 1-100 nm. Some EUV scanners provide 4×reduction projection printing, similar to some optical scanners, except that the EUV scanners use reflective rather than refractive optics, i.e., mirrors instead of lenses. One type of EUV light source is laser-produced plasma (LPP). LPP technology produces EUV light by focusing a high-power laser beam onto small tin droplet targets to form highly ionized plasma that emits EUV radiation with a peak maximum emission at 13.5 nm. The EUV light is then collected by a LPP collector and reflected by optics towards a lithography target, e.g., a wafer. The LPP collector is subjected to damage and degradation due to the impact of particles, ions, radiation, and most seriously, tin deposition.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
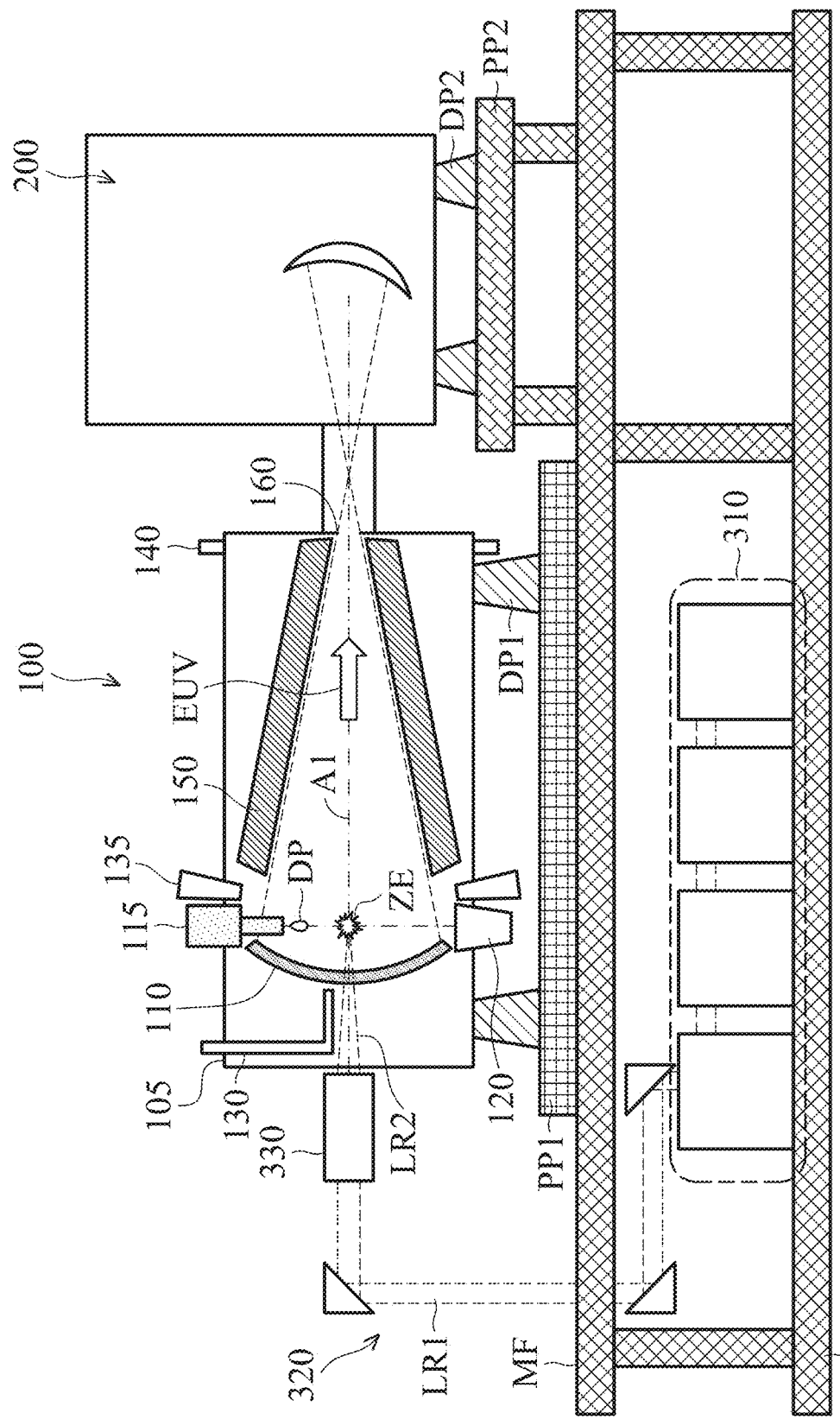
FIG. 1 is a schematic view of an EUV lithography system with a laser produced plasma (LPP) EUV radiation source, constructed in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of."

The present disclosure is generally related to extreme ultraviolet (EUV) lithography system and methods. More particularly, it is related to apparatus and methods for mitigating contamination on a collector in a laser produced plasma (LPP) EUV radiation source. The collector, also referred to as an LPP collector or an EUV collector, is an important component of the LPP EUV radiation source. It collects and reflects EUV radiation and contributes to overall EUV conversion efficiency. However, it is subjected to damages and degradations due to the impact of particles, ions, radiation, and debris deposition. In particular, a tin (Sn) debris is one of the contamination sources to the EUV collector. One of the objectives of the present disclosure is directed to reducing debris deposition onto the LPP collector thereby increasing its usable lifetime.

FIG. 1 is a schematic and diagrammatic view of an EUV lithography system. The EUV lithography system includes an EUV radiation source apparatus 100 to generate EUV light, an exposure tool 200, such as a scanner, and an excitation laser source apparatus 300. As shown in FIG. 1, in some embodiments, the EUV radiation source apparatus 100 and the exposure tool 200 are installed on a main floor MF of a clean room, while the excitation source apparatus 300 is installed in a base floor BF located under the main floor. Each of the EUV radiation source apparatus 100 and the exposure tool 200 are placed over pedestal plates PP1 and PP2 via dampers DP1 and DP2, respectively. The EUV radiation source apparatus 100 and the exposure tool 200 are coupled to each other by a coupling mechanism, which may include a focusing unit.

The lithography system is an extreme ultraviolet (EUV) lithography system designed to expose a resist layer by EUV light (or EUV radiation). The resist layer is a material sensitive to the EUV light. The EUV lithography system employs the EUV radiation source apparatus 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure tool 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss.

In the present disclosure, the terms mask, photomask, and reticle are used interchangeably. In the present embodiment, the mask is a reflective mask. One exemplary structure of the mask includes a substrate with a suitable material, such as a low thermal expansion material or fused quartz. In various examples, the material includes $TiO_2$ doped $SiO_2$, or other suitable materials with low thermal expansion. The mask includes multiple reflective multiple layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The exposure tool 200 includes a projection optics module for imaging the pattern of the mask on to a semiconductor substrate with a resist coated thereon secured on a substrate stage of the exposure tool 200. The projection optics module generally includes reflective optics. The EUV radiation (EUV light) directed from the mask, carrying the image of the pattern defined on the mask, is collected by the projection optics module, thereby forming an image onto the resist.

In the present embodiments, the semiconductor substrate is a semiconductor wafer, such as a silicon wafer or other type of wafer to be patterned. The semiconductor substrate is coated with a resist layer sensitive to the EUV light in the present embodiment. Various components including those described above are integrated together and are operable to perform lithography exposing processes.

The lithography system may further include other modules or be integrated with (or be coupled with) other modules.

As shown in FIG. 1, the EUV radiation source 100 includes a target droplet generator 115 and a LPP collector 110, enclosed by a chamber 105. The target droplet generator 115 generates a plurality of target droplets DP. In some embodiments, the target droplets DP are tin (Sn) droplets. In some embodiments, the tin droplets each have a diameter about 30 microns ($\mu$m). In some embodiments, the tin droplets DP are generated at a rate about 50 droplets per second and are introduced into a zone of excitation ZE at a speed about 70 meters per second (m/s). Other material can also be used for the target droplets, for example, a tin containing liquid material such as eutectic alloy containing tin or lithium (Li).

The excitation laser LR2 generated by the excitation laser source apparatus 300 is a pulse laser. In some embodiments, the excitation layer includes a pre-heat laser and a main laser. The pre-heat laser pulse is used to heat (or pre-heat) the target droplet to create a low-density target plume, which is subsequently heated (or reheated) by the main laser pulse, generating increased emission of EUV light.

In various embodiments, the pre-heat laser pulses have a spot size about 100 $\mu$m or less, and the main laser pulses have a spot size about 200-300 $\mu$m.

The laser pulses LR2 are generated by the excitation laser source 300. The laser source 300 may include a laser generator 310, laser guide optics 320 and a focusing apparatus 330. In some embodiments, the laser source 310 includes a carbon dioxide ($CO_2$) or a neodymium-doped yttrium aluminum garnet (Nd:YAG) laser source. The laser light LR1 generated by the laser generator 300 is guided by the laser guide optics 320 and focused into the excitation laser LR2 by the focusing apparatus 330, and then introduced into the EUV radiation source 100.

The laser light LR2 is directed through windows (or lenses) into the zone of excitation ZE. The windows adopt a suitable material substantially transparent to the laser beams. The generation of the pulse lasers is synchronized with the generation of the target droplets. As the target droplets move through the excitation zone, the pre-pulses heat the target droplets and transform them into low-density target plumes. A delay between the pre-pulse and the main pulse is controlled to allow the target plume to form and to expand to an optimal size and geometry. When the main pulse heats the target plume, a high-temperature plasma is generated. The plasma emits EUV radiation EUV, which is collected by the collector mirror 110. The collector 110 further reflects and focuses the EUV radiation for the lithography exposing processes. In some embodiments, a droplet catcher 120 is installed opposite the target droplet generator 115. The droplet catcher 120 is used for catching excessive target droplets. For example, some target droplets may be purposely missed by the laser pulses.

The collector 110 is designed with a proper coating material and shape to function as a mirror for EUV collection, reflection, and focusing. In some embodiments, the collector 110 is designed to have an ellipsoidal geometry. In some embodiments, the coating material of the collector 100 is similar to the reflective multilayer of the EUV mask. In some examples, the coating material of the collector 110 includes a ML (such as a plurality of Mo/Si film pairs) and may further include a capping layer (such as Ru) coated on the ML to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern.

In such an EUV radiation source apparatus, the plasma caused by the laser application creates physical debris, such as ions, gases and atoms of the droplet, as well as the desired EUV radiation. It is necessary to prevent the accumulation of material on the collector 110 and also to prevent physical debris exiting the chamber 105 and entering the exposure tool 200.

As shown in FIG. 1, in the present embodiments, a buffer gas is supplied from a first buffer gas supply 130 through the aperture in collector 110 by which the pulse laser is delivered to the tin droplets. In some embodiments, the buffer gas is $H_2$, He, Ar, N or another inert gas. In certain embodiments, $H_2$ is used as H radicals generated by ionization of the buffer gas can be used for cleaning purposes. The buffer gas can also be provided through one or more second buffer gas supplies 135 toward the collector 110 and/or around the edges of the collector 110. Further, the chamber 105 includes one or more gas outlets 140 so that the buffer gas is exhausted outside the chamber 105.

Hydrogen gas has low absorption to the EUV radiation. Hydrogen gas reaching to the coating surface of the collector 110 reacts chemically with a metal of the droplet forming a hydride, e.g., metal hydride. When tin (Sn) is used as the droplet, stannane ($SnH_4$), which is a gaseous byproduct of the EUV generation process, is formed. The gaseous $SnH_4$ is then pumped out through the outlet 140. However, it is difficult to exhaust all gaseous $SnH_4$ from the chamber and to prevent the $SnH_4$ from entering the exposure tool 200.

To trap the $SnH_4$ or other debris, one or more debris collection mechanisms (DCM) 150 are employed in the chamber 105.

Figure 2B:
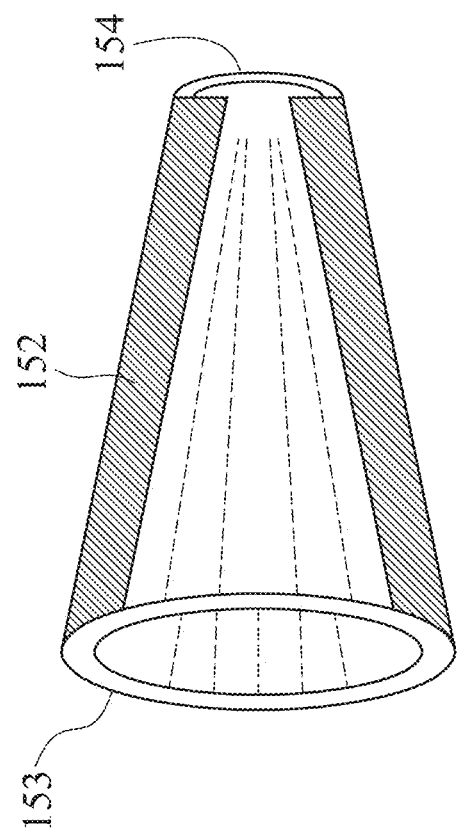
FIG. 2B is a schematic side view of a debris collection mechanism used in the EUV radiation source according to some embodiments of the present disclosure.
Figure 2A:
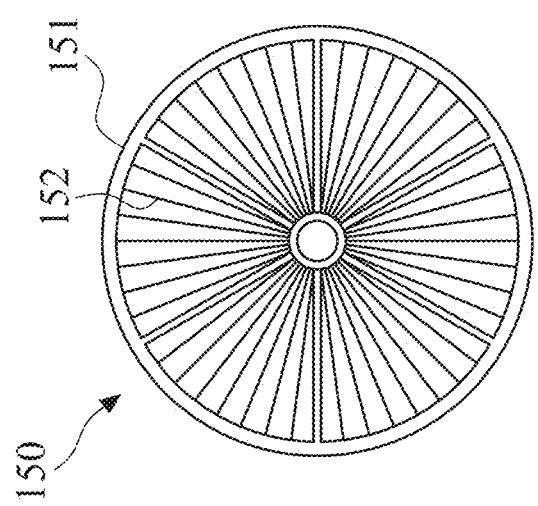
FIG. 2A is a schematic front view of a debris collection mechanism used in the EUV radiation source according to some embodiments of the present disclosure.
Figure 2C:
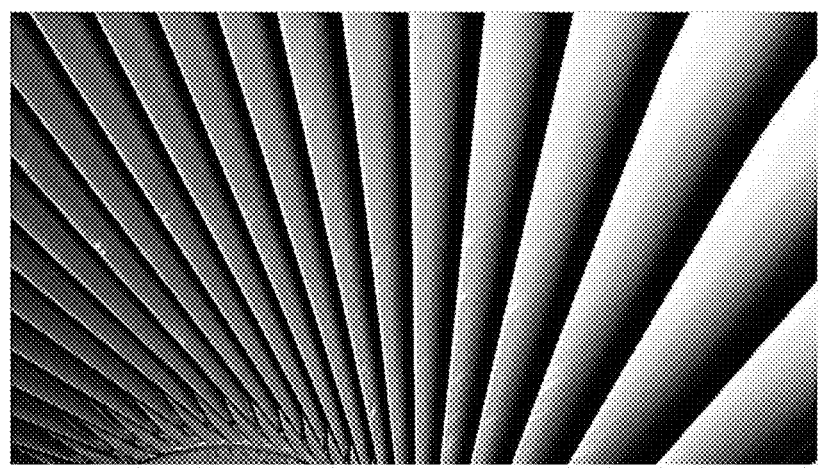
FIG. 2C is a partial picture of a vane used in the EUV radiation source according to some embodiments of the present disclosure.

As shown in FIG. 1, one or more DCMs 150 are disposed along optical axis A1 between the zone of excitation ZE and an output port 160 of the EUV radiation source 100. FIG. 2A is a front view of the DCM 150 and FIG. 2B is a schematic side view of DCM 150. FIG. 2C is a partial picture of the DCM 150. The DCM 150 includes a frustoconical support frame 151, a first end support 153 and a second end support 154 that operably support a plurality of vanes 152 that rotate within the housings. The first end support 153 has a larger diameter than the second end support 154. The DCM 150 serves to prevent the surface of collector 110 and/or other elements/portions of the inside the chamber 105 from being coated by Sn vapor by sweeping out slow Sn atoms and/or $SnH_4$ via rotating vanes 152.

The plurality of vanes 152 project radially inwardly from the frustoconical support frame 151. The vanes 152 are thin and elongate plates. In some embodiments, each of the vanes has a triangular or trapezoid or trapezium shape in plan view. The vanes 152 are aligned so that their longitudinal axes are parallel to the optical axis A1 so that they present the smallest possible cross-sectional area to the EUV radiation EUV. The vanes 152 project towards the optical axis A1, but do not extend as far as the optical axis. In some embodiments, a central core of the DCM 150 is empty. The DCM 150 is driven to rotate by a drive unit including one or more motors, one or more belts and/or one or more gears, or any rotating mechanism. The vanes 152 are heated at 100° C. to 400° C. by a heater in some embodiments.

Figure 3A:
FIGS. 3A and 3B illustrate schematic cross sectional views of a vane with a catalytic layer according to some embodiments of the present disclosure.

The DCM 150 is made of suitable material such as stainless steel, Cu, Al or ceramics. In certain embodiments, the DCM 150 is made of stainless steel. In the present embodiments, the surface of the DCM 150, in particular the surface of vanes 152, is coated with a catalytic material 158 that can reduce $SiH_4$ to Sn, as shown in FIG. 3A. The catalytic material includes ruthenium (Ru), tin (Sn), tin oxide, titanium oxide, or any combination thereof. In some embodiments, Ru is used. The Ru coated surface of the DCM 150 reduces $SiH_4$ to Sn, and traps Sn thereon.

Ruthenium may be coated on the surface of the vanes by a thermal deposition method, an e-beam deposition method or any other suitable film formation methods. The thickness of the Ru layer is in a range from about 2 nm to about 50 nm in some embodiments. Similar methods and configurations may be applied to catalytic layers comprising another material.

Figure 3B:
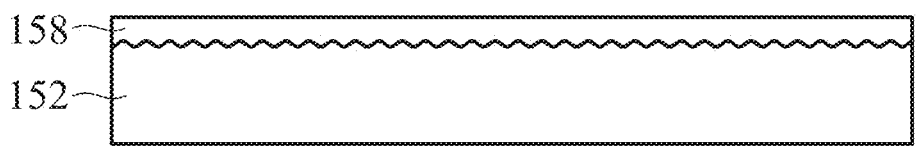

Further, in some embodiments of the present disclosure, the surface of vanes 152 has a roughened structure as shown in FIG. 3B, and the catalytic layer 158 is formed on the roughened surface. The roughened surface has nano-scale microstructures which are regularly and/or irregularly/randomly arranged.

Figure 4A:
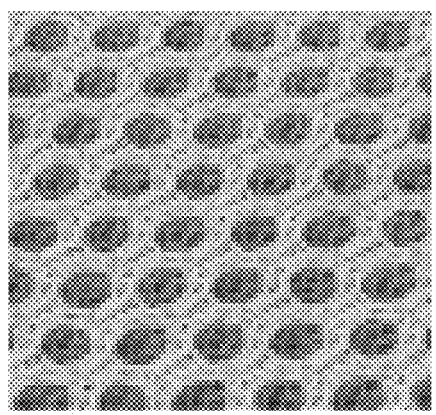
FIGS. 4A, 4B, 4C, and 4D illustrate various surface textures of the vane according to some embodiments of the present disclosure.

In some embodiments, as shown in FIG. 4A, the surface of vanes 152 has regularly formed depressions or holes, each of which size (e.g., a diameter or a largest width) is in a range from about 10 nm to about 500 nm. The depth of the depressions or holes is in a range from about 50 nm to about 1000 nm in some embodiments. The depressions or holes are two dimensionally arranged with a pitch of about 20 nm to about 1000 nm in some embodiments.

The shape of the opening of the depressions or holes may be circular, ellipsoid or polygonal.

Figure 4B:
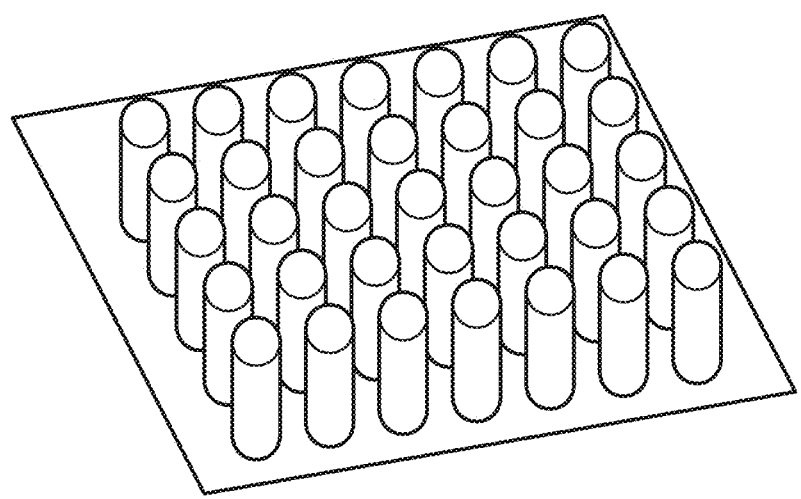

In other embodiments, as shown in FIG. 4B, the surface of vanes 152 has regularly formed protrusions, each of which size (e.g., a diameter or a largest width) is in a range from about 10 nm to about 500 nm. The height of the protrusions is in a range from about 50 nm to about 1000 nm in some embodiments. The protrusions are two-dimensionally arranged with a pitch of about 20 nm to about 1000 nm in some embodiments. The top shape of the protrusions may be circular, ellipsoid or polygonal. The protrusions may have a columnar, a pyramidal or conical shape.

The regular nano-structure shown in FIGS. 4A and 4B can be formed by suitable patterning operations including lithography and etching operations. The nano-structures may be formed by nano-printing technologies.

Figure 4C:
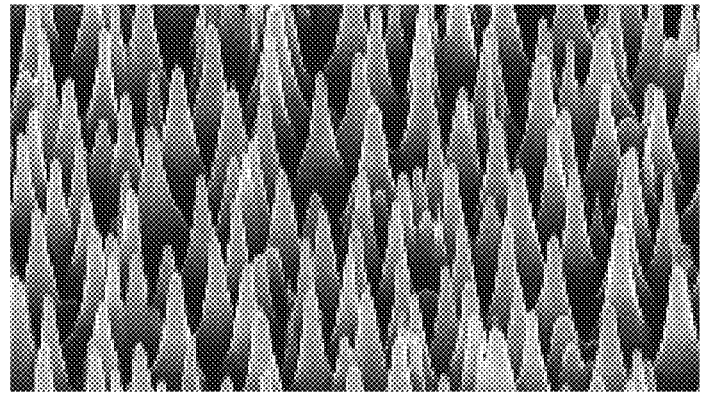

In some embodiments, the surface of vanes 152 has irregularly formed nano-structures. As shown in FIG. 4C, the surface of vanes 152 has irregularly formed protrusions, each of which diameter is in a range from about 5 nm to about 500 nm. The height of the protrusions is in a range from about 50 nm to about 1000 nm in some embodiments. The protrusions may have a columnar, a pyramidal or conical shape. The irregular nano-structures may be formed by a sand blast method, a wet etching method using an acid or alkaline solution, an ion bombardment method or a plasma etching method. The arithmetic average surface roughness Ra of the roughened surface is in a range from about 10 nm to about 500 nm in some embodiments, and in in a range from about 50 nm to about 200 nm in other embodiments.

Figure 4D:
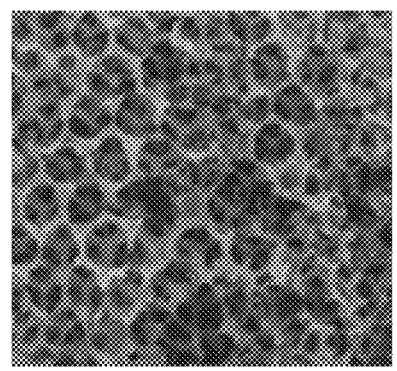

In certain embodiments, the surface of vanes 152 has a porous structure. As shown in FIG. 4D, the surface of vanes 152 has a porous structure, and each of the pores has a size in a range from about 5 nm to about 500 nm. The porous structures may be formed by a sand blast method, a wet etching method using an acid or alkaline solution, an ion bombardment method or a plasma etching method. The surface roughness Ra of the roughened surface is in a range from about 10 nm to about 500 nm in some embodiments, and in in a range from about 50 nm to about 200 nm in other embodiments.

In the foregoing embodiments, the surfaces of the vanes 152 are directly formed to have nano-structures, and then the catalytic layer is formed on the roughened surface. In other embodiments, one or more additional layers having nano-structures is formed on the surface of the vanes and then the catalytic layer is formed on the one or more additional layers.

In some embodiments, the nano-scale roughened surface can be formed by, for example, depositing nano-scale particles using a thermal deposition method, a physical vapor deposition method, a chemical vapor deposition method and/or a coating method. In other embodiments, a wet treatment or a thermal treatment is performed on the surface of the vanes to form the nano-scale roughened surface. In certain embodiments, the vanes include two or more layers and the layer disposed at the surface of the vanes are vaporized or sublimated, thereby forming nano-scale roughened surface. In some embodiments, a sand blasting method is performed to form the nano-scale roughened surface.

By making the surface of vanes 152 nano-scale-roughened surface, it is possible to enlarge a surface area of the catalytic layer 158 and thus it is possible to enhance the reduction efficiency of $SnH_4$ at the surface of vanes.

In the foregoing embodiments, a catalytic layer is made of a material, such as Ru, to reduce $SnH_4$ to Sn. When the droplet used to generate EUV radiation is made of a different material than Sn, the same as or different catalytic material can be used as the a catalytic material layer 158.

It will be understood that not all advantages have been necessarily discussed herein, no particular advantage is required for all embodiments or examples, and other embodiments or examples may offer different advantages.

In the present disclosure, by applying a catalytic layer made of, for example, Ru, on the surface of vanes in the debris collection mechanism (DCM), it is possible to reduce SnH4 vapor to metal Sn, and thus it is possible to prevent contamination of Sn debris on the collector. Therefore, it is possible to extend a life of the collector in the EUV radiation source for a EUV lithography system.

According to one aspect of the present disclosure, a debris collection device for an extreme ultra violet (EUV) radiation source apparatus includes a first end support, a second end support and a plurality of vanes, ends of which are supported by the first end support and the second end support, respectively. A surface of at least one of the plurality of vanes is coated by a catalytic layer, which reduces a hydride.

According to another aspect of the present disclosure, an extreme ultra violet (EUV) radiation source apparatus includes a collector, a target droplet generator for generating a tin (Sn) droplet, a rotatable debris collection device and a chamber enclosing at least the collector and the rotatable debris collection device. The rotatable debris collection device includes a first end support, a second end support and a plurality of vanes, ends of which are supported by the first end support and the second end support, respectively. A surface of at least one of the plurality of vanes is coated by a catalytic layer, which reduces $SnH_4$ to Sn.

According to yet another aspect of the present disclosure, in a method for generating an extreme ultra violet (EUV) radiation, a tin droplet is irradiated with laser light in a hydrogen gas ambient, thereby creating the EUV radiation. $SnH_4$ is reduced by using a debris collection device to Sn, thereby collecting debris. The debris collection device includes a plurality of vanes, opposing ends of which are supported by a first end support and a second end support, respectively, and a surface of at least one of the plurality of vanes is coated with a Ru layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A debris collection device for an extreme ultra violet (EUV) radiation source apparatus, comprising:
    a first end support;
    a second end support; and
    a plurality of vanes, ends of which are supported by the first end support and the second end support, respectively,
    wherein a surface of at least one of the plurality of vanes is coated by a catalytic layer, which reduces $SnH_4$ to Sn, and
    wherein the catalytic layer includes titanium oxide and Ru disposed on the at least one of the plurality of vanes.

2. The debris collection device of claim 1, wherein:
    the surface of the at least one of the plurality of vanes includes a roughened surface, and
    the catalytic layer is coated on the roughened surface.

3. The debris collection device of claim 2, wherein the roughened surface includes regularly formed structures.

4. The debris collection device of claim 3, wherein the regularly formed structures include at least one selected from the group consisting of a plurality of projections and a plurality of protrusions.

5. The debris collection device of claim 4, wherein a size of each of the regularly formed structures is in a range from 10 nm to 500 nm.

6. The debris collection device of claim 2, wherein the roughened surface includes irregularly formed structures.

7. The debris collection device of claim 2, wherein an arithmetic average surface roughness Ra of the roughened surface is in a range from 10 nm to 500 nm.

8. An extreme ultra violet (EUV) radiation source apparatus, comprising:
    a target droplet generator for generating a tin (Sn) droplet;
    a debris collection device; and
    a chamber enclosing at least the debris collection device, wherein:
    the debris collection device includes
        a first end support;
        a second end support; and
        a plurality of vanes, ends of which are supported by the first end support and the second end support, respectively,
        a surface of at least one of the plurality of vanes includes a catalytic layer including titanium oxide and Ru, which reduces $SnH_4$ to Sn.

9. The EUV radiation source apparatus of claim 8, wherein the plurality of vanes further include a roughened surface including regularly formed structures.

10. The EUV radiation source apparatus of claim 9, wherein a size of each of the regularly formed structures is in a range from 10 nm to 500 nm.

11. The EUV radiation source apparatus of claim 9, wherein the regularly formed structures includes depressions or holes.

12. The EUV radiation source apparatus of claim 11, wherein a depth of the depressions or holes is in a range from 50 nm to 1000 nm.

13. The EUV radiation source apparatus of claim 11, wherein the depressions or the holes are two dimensionally arranged with a pitch of 20 nm to 1000 nm.

14. The EUV radiation source apparatus of claim 9, wherein the regularly formed structures includes protrusions.

15. The EUV radiation source apparatus of claim 14, wherein a height of the protrusions is in a range from 50 nm to 1000 nm.

16. The EUV radiation source apparatus of claim 14, wherein the protrusions are two dimensionally arranged with a pitch of 20 nm to 1000 nm.

17. A method for generating extreme ultra violet (EUV) radiation, comprising:

irradiating a tin droplet with laser light in a hydrogen gas ambient, thereby creating the EUV radiation;

reducing $SnH_4$ to Sn by using a catalytic layer including titanium oxide and Ru coated on at least a surface of one of a plurality of vanes of a debris collection device, wherein opposing ends of the plurality of vanes are supported by a first end support and a second end support, respectively; and collecting debris using the debris collecting device.

18. The method according to claim 17, wherein:

the surface of the at least one of the plurality of vanes includes a roughened surface, and the catalytic layer is coated on the roughened surface.

19. The method according to claim 18, wherein the roughened surface includes regularly formed structures, and the regularly formed structures include at least one selected from the group consisting of a plurality of projections and a plurality of protrusions.

20. The method according to claim 18, wherein a size of each of the regularly formed structures is in a range from 10 nm to 500 nm.

* * * * *